United States Patent
Hendriks et al.

(10) Patent No.: US 12,365,004 B2
(45) Date of Patent: Jul. 22, 2025

(54) DEVICE AND METHOD OF FILLING GROOVES

(71) Applicant: Nederlandse Organisatie voor toegepast-natuurwetenschappelijk onderzoek TNO, 's-Gravenhage (NL)

(72) Inventors: Rob Jacob Hendriks, Waalre (NL); Robin Bernardus Johannes Koldeweij, Gorinchem (NL); Md Tahmid Hossain, Helmond (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 72 days.

(21) Appl. No.: 18/032,905

(22) PCT Filed: Oct. 22, 2021

(86) PCT No.: PCT/NL2021/050641
§ 371 (c)(1),
(2) Date: Apr. 20, 2023

(87) PCT Pub. No.: WO2022/086331
PCT Pub. Date: Apr. 28, 2022

(65) Prior Publication Data
US 2023/0398565 A1  Dec. 14, 2023

(30) Foreign Application Priority Data
Oct. 23, 2020 (EP) .................................. 20203659

(51) Int. Cl.
*B05C 5/02*   (2006.01)
*B05C 11/10*  (2006.01)
(Continued)

(52) U.S. Cl.
CPC .......... *B05C 5/0262* (2013.01); *B05C 5/0229* (2013.01); *B05C 11/1039* (2013.01);
(Continued)

(58) Field of Classification Search
None
See application file for complete search history.

(56) References Cited

U.S. PATENT DOCUMENTS 5,947,022 A   9/1999  Freeman et al.
6,276,270 B1  8/2001  Leanna
(Continued)

FOREIGN PATENT DOCUMENTS

CN   1655933 A    8/2005
CN   101500739 A  8/2009
(Continued)

OTHER PUBLICATIONS

China National Intellectual Property Administration, Office Action in corresponding Chinese Application No. 202180076992.4 dated Oct. 24, 2024.
(Continued)

*Primary Examiner* — Binu Thomas
(74) *Attorney, Agent, or Firm* — Leydig, Voit & Mayer, Ltd.

(57) ABSTRACT

The present disclosure pertains to a deposition system, a method and use of such system for filling a groove provided into surface of a workpiece with a printable medium, in particular a highly viscous paste. The system includes a deposition head that includes a first deposition chamber that extends to a first orifice. The orifice is reversibly closed off between at least two shutter elements. In some embodiments the system is a dual chamber system, each chamber having a reversible closable orifice. The system is arranged to maintain a flush physical relationship between the work-
(Continued)

FIG. 5 piece and the terminal ends of the shutter elements, so as to, upon application of a working pressure, fill the groove.

10 Claims, 12 Drawing Sheets

(51) Int. Cl.
    *B05D 1/26*     (2006.01)
    *B33Y 30/00*     (2015.01)

(52) U.S. Cl.
    CPC .............. *B05D 1/265* (2013.01); *B33Y 30/00* (2014.12); *H05K 2203/0126* (2013.01)

(56) References Cited

U.S. PATENT DOCUMENTS

| | | |
|---|---|---|
| 6,684,766 B1 | 2/2004 | Macraild et al. |
| 7,337,720 B2 | 3/2008 | Ross et al. |
| 8,371,217 B2 | 2/2013 | Edmonds |
| 2001/0008118 A1* | 7/2001 | Bernert ................. B05C 5/0283 118/123 |
| 2001/0038882 A1* | 11/2001 | Onishi ................. H05K 3/1233 118/692 |
| 2002/0166505 A1* | 11/2002 | Hikami ................. H05K 3/1233 118/108 |
| 2006/0011075 A1* | 1/2006 | Claiborne ............ H05K 3/1233 101/126 |
| 2010/0139509 A1 | 6/2010 | Edmonds |
| 2013/0199386 A1 | 8/2013 | Lynch et al. |
| 2016/0046117 A1 | 2/2016 | Mitani |

FOREIGN PATENT DOCUMENTS

| | | |
|---|---|---|
| CN | 104203579 A | 12/2014 |
| CN | 204936416 U | 1/2016 |
| JP | 2000062138 A | 2/2000 |
| JP | 2007106103 A | 4/2007 |
| TW | 201105820 A | 2/2011 |

OTHER PUBLICATIONS

European Patent Office, International Search Report in corresponding International Application No. PCT/NL2021/050641, dated Jan. 31, 2022 (3 pages).

* cited by examiner

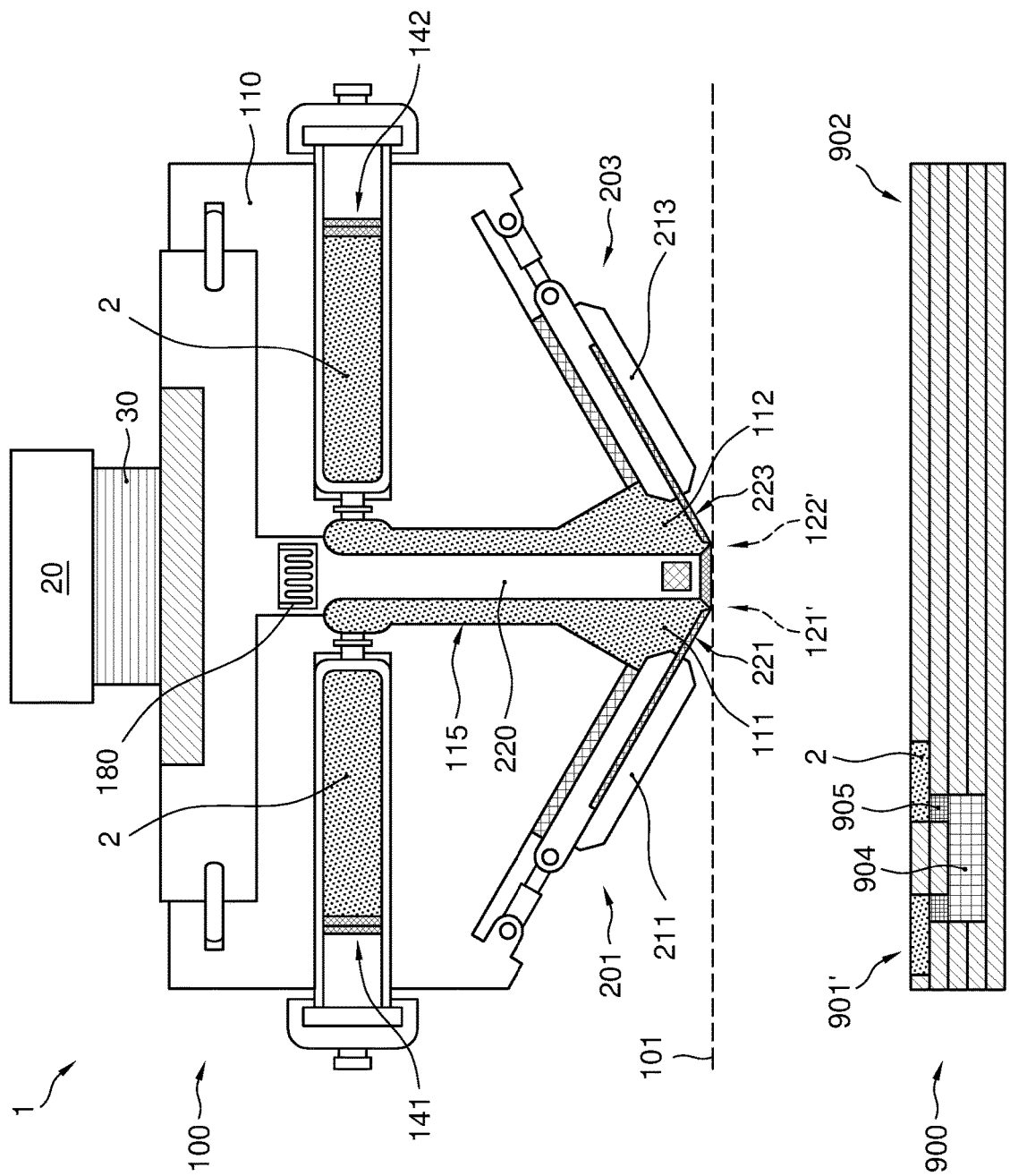

DEVICE AND METHOD OF FILLING GROOVES

CROSS-REFERENCE TO RELATED APPLICATIONS

This patent application is a U.S. National Phase of PCT International Application No. PCT/NL2021/050641, filed Oct. 22, 2021, which claims priority to European Application No. 20203659.6, filed Oct. 23, 2020, which are both expressly incorporated by reference in their entireties, including any references contained therein.

TECHNICAL FIELD AND BACKGROUND

The present disclosure relates to a method and system for depositing a printable medium into grooves provided within a surface of a workpiece. In particular to filling of grooves with a high solid content paste.

Filling grooves within a surface of a workpiece by dragging an amount of filler material, such as a paste, across the surface using a doctor blade positioned under a forward angle to the surface disadvantageously readily results in incomplete filling of the grooves. For example, due to inclusion of air trapped under the deposited material as the doctor blade is pulled across the groove. In particular, for adhesives and/or electrically conductive materials such as solder pastes, incomplete filling may lead to failure of the final products, e.g. due to a loss of conductivity. Similar issues are known from screen printing, wherein squeegees or doctor blades are commonly used to force a viscous paste trough a partly blocked mesh. The deposition thickness and quality is mainly dependent on the screen type, hardness of the squeegee, angle of the squeegee and the printing speed.

As an alternative to using a squeegees, pumping systems have been reported in combination with screen printing WO0105592A1 discloses a screen printing head for applying a pasty product to a printing screen. The head includes a chamber having an opening through which the pasty product is forced into the screen. The chamber is laterally bound between a pair of laterally separated blades which in use are forced onto the screen. A flow director positioned between the blades is provides circulatory flow with the aim to improve filling of screen. US201039509A1 improves upon this concept by providing a rotating drum as flow director. Pumping systems are mainly used for printing solder pastes or conductive adhesives in the printed circuit board (PCB) manufacturing industry. While pumping systems can be used in combination with screen printing (through cavities), in particular with dedicated screen printing pastes, there remains a need for an improved method or device for filling grooves within a substrate of a workpiece. In particular there remains a need for a device that is arranged for depositing a broader range of materials, e.g. higher solid content pastes, and/or that offers one or more of: improved deposition rates; improved control over a filling level; reduced deposition and/or spillage at non-target areas (e.g. besides the grooves); and/or a reduced wear to workpiece and/or device, in particular for workpieces have comparatively soft outer surface finish.

SUMMARY

Aspects of the present disclosure relate to a deposition system for depositing a printable medium in a groove or cavity as provided within a surface of a workpiece. The deposition system comprises a deposition head including a deposition face and a drive unit for providing relative motion between the deposition head and the workpiece in a direction transverse to the surface of the workpiece. The deposition head comprises a main body, including at least a first deposition chamber. The first deposition chamber is at least in part defined by a recess in the main body. The first deposition chamber extends to a first orifice in the deposition face between at least two shutter elements. The deposition head further comprises at least a first pressurizing mechanism that is arranged to act on the first deposition chamber and that is configured to, in use, apply a first working pressure onto an amount of printable medium contained in the first deposition chamber. The deposition system further comprises at least a first mount that is provided to the main body. Said at least two shutter elements include a first shutter element. The first shutter element comprises a first blade that extends from the first mount towards an other of the at the least two shutter elements to close the first orifice between a terminal ends of the first blade and a terminal end of the other of the at least two shutter elements in a closed condition. The first blade being configured to flex in response to an applied first working pressure to at least partly open the first orifice. The drive unit is arranged to in use adjust a relative position between the main body and the surface of the workpiece to, in use, maintain a flush contact between the surface of the workpiece and the terminal ends of the first blade and the other of the at least two shutter elements while in a flexed condition.

In a preferred embodiment, the other of the at least two shutter elements includes a separator wall that extends longitudinally through the recess to define a second deposition chamber that is laterally separated from the first deposition chamber. Said second deposition chamber extends to a second orifice in the deposition face between the other of the at least two shutter elements and a further shutter element. Said further shutter element comprises a second blade that extends from a corresponding second mount towards the other of the at least two shutter elements to close the second orifice between terminal ends of the second blade and the other of the at least two shutter elements in a closed condition. The second mount being provided to the main body opposite the first mount across the recess. The deposition system preferably further comprises a second pressurizing mechanism that is arranged to in use act on the second deposition chamber, and that is configured to in use apply a second working pressure, typically different form the first, onto a printable medium contained in the second deposition chamber. The second blade being configured to flex in response to an applied second working pressure to at least partly open the second orifice. Said system, comprising at least a first and a second working chamber can be understood to constitute a dual chamber system. Said dual chamber system allows deposition of one or more printable medium from two separate orifices. The printable medium in 1st and 2nd chamber is typically the same but can be different. Using two mutually different compositions allows filling grooves with a two-layer filling, e.g. an electrically conductive bottom layer and a comparatively more adhesive or protective closing layer. Typically however, similar compositions or even one and the same composition is used.

In a further or even more preferred embodiment, the first mount is arranged to in use adjust a position and/or orientation of the first blade relative to the main body in dependence of at least the first working pressure, so as to, in use, at least partly counteract a contact pressure between the terminal end of the first blade and the surface of the workpiece.

According to further aspects the present disclosure relates to a method of depositing a printable medium in a groove provided within a surface of a workpiece by one or more of the deposition systems as disclosed herein. The method comprising the steps of: applying a first working pressure onto a printable medium contained in the first deposition chamber to flex the first blade so as to at least partly open the first orifice while providing a relative motion between the main body and the workpiece in a direction transverse to the surface of the workpiece so as to maintain a flush contact between the surface of the workpiece and the terminal ends of the first blade and the other of the at least two shutter elements; and providing a relative motion between the deposition head and the workpiece in a lateral direction along the surface of the workpiece to guide the deposition head across the grooves, preferably while maintaining said flush contact.

In a preferred embodiment, and in line with systems comprising at least a first and a second working chamber, also referred to as dual chamber systems, the method further comprises applying a second working pressure onto a printable medium contained in the second deposition chamber to flex the second blade to at least partly open the second orifice while applying the second working pressure. Preferably, the first working pressure is higher than the second working pressure if the first orifice is leading and the second orifice is trailing as seen along the direction of lateral motion while the deposition head is guided across the groove, or wherein the second working pressure is higher than the first working pressure if the second orifice is leading and the first orifice is trailing.

In a further or even more preferred embodiment, and in line with systems wherein the first mount is arranged to in use adjust a position and/or orientation of the first blade relative to the main body in dependence of at least the first working pressure, the method comprises repositioning and/or reorienting the first blade relative to the main body so as to at least partly counteract a contact pressure between the terminal end of the first blade and the surface of the workpiece.

According to yet further aspects, the present disclosure relates to a method or use of a dual chamber system, as disclosed herein to clean a groove and/or to remove soluble or adsorbed matter from a workpiece. Said process at least comprising depositing a printable medium that is a suitable cleaning agent for said matter onto said workpiece from the first deposition chamber by applying a suitable first working pressure. and recovering at least part of the deposited printable medium via the second deposition chamber by applying a suitable second working pressure.

The deposition system as disclosed herein offers a number of benefits over known methods such as screen printing and/or doctor blading. As will described in more detail hereinbelow these benefits include one or more of improved deposition rate, improved control over a filling level, reduced deposition and/or spillage at non-target areas, e.g. besides the grooves, and/or a reduced wear to workpiece and/or device.

BRIEF DESCRIPTION OF DRAWINGS

These and other features, aspects, and advantages of the apparatus, systems and methods of the present disclosure will become better understood from the following description, appended claims, and accompanying drawing wherein:

FIGS. 3 and 4 illustrate a cross section sideview of a deposition system in closed and open condition;

DESCRIPTION OF EMBODIMENTS

Figure 1A:
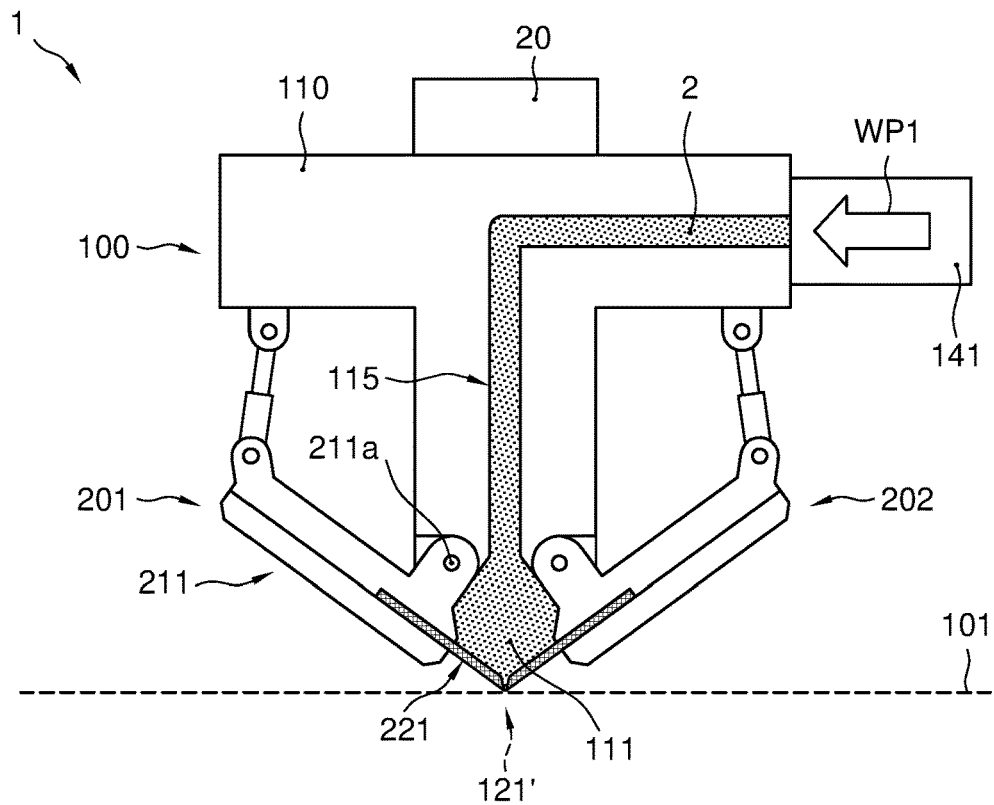
FIG. 1A illustrates a cross section sideview of a deposition system in closed condition.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The systems and methods as described herein are not be construed as being limited to any particular printable medium. In principle the printable medium can be understood to include a broad variety of compositions including liquids such as solvents and solvent based inks, but also high viscous media such as pasty products. Common solvent based inks typically contain up to 40 weight percent solids such as copper, the solvent generally contributes to the majority of the total ink volume. This means that the filling level of a groove, upon evaporation of the solvent, reduces to a fraction of the initially filling level. For inkjet inks the filling level of a groove is typically reduced to about 3 to 5 volume percent of an initial filling level, even for inks initially containing between 20 and 40 weight percent copper. As a consequence between 20 and 40 filling cycles can be required to completely fill a groove with functional material. To more effectively fill grooves highly loaded pastes are preferred. Use of high solid content pastes such as screen pastes (known to have between 60 and 75 wt % metal content) can reduce the number of filling steps required. Even higher loaded pastes, e.g. having a solids content in a range above 80 wt %, e.g. 85-99 wt % such as wt %, would be more preferable. However, up till now constrains, e.g. due to high viscosity—render it difficult to quickly fill the grooves. Further, proneness to drying—due to a limited amount of solvent, has rendered application of such media for filling of grooves unfeasible.

It will be appreciated that the systems and methods as described herein can be used to particular advantage in combination with media having a high viscosity, in particular with pasty products such as screen pastes or even higher loaded pastes. The system can even be used to deposit inks or pastes having a viscosity above 500 Pa·s, e.g. in range around 1000 Pa·s. (Haake RS1 C20/2° TiL at 230 sec$^{-1}$ at 25° C.). Pastes with such high viscosities are highly unusual in printing industry and are typically regarded as unsuitable for known devices and methods such as screen printing, which employ inks/pastes with a viscosity in a range of up to about Pa·s. Enabling use of comparatively higher solid content pastes (i.e. more viscous pastes can reduce a number of passes required to get a comparable fill level. As will be explained in more detail hereinbelow, the system can further increase filling rates (amounting to a further reduced overall process time), e.g. by increasing the pressure that is applied so as to force the material, e.g. paste, into the groove.

The invention is described more fully hereinafter with reference to the accompanying drawings, in which embodiments of the invention are shown. In the drawings, the absolute and relative sizes of systems, components, layers, and regions may be exaggerated for clarity.

Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1B:
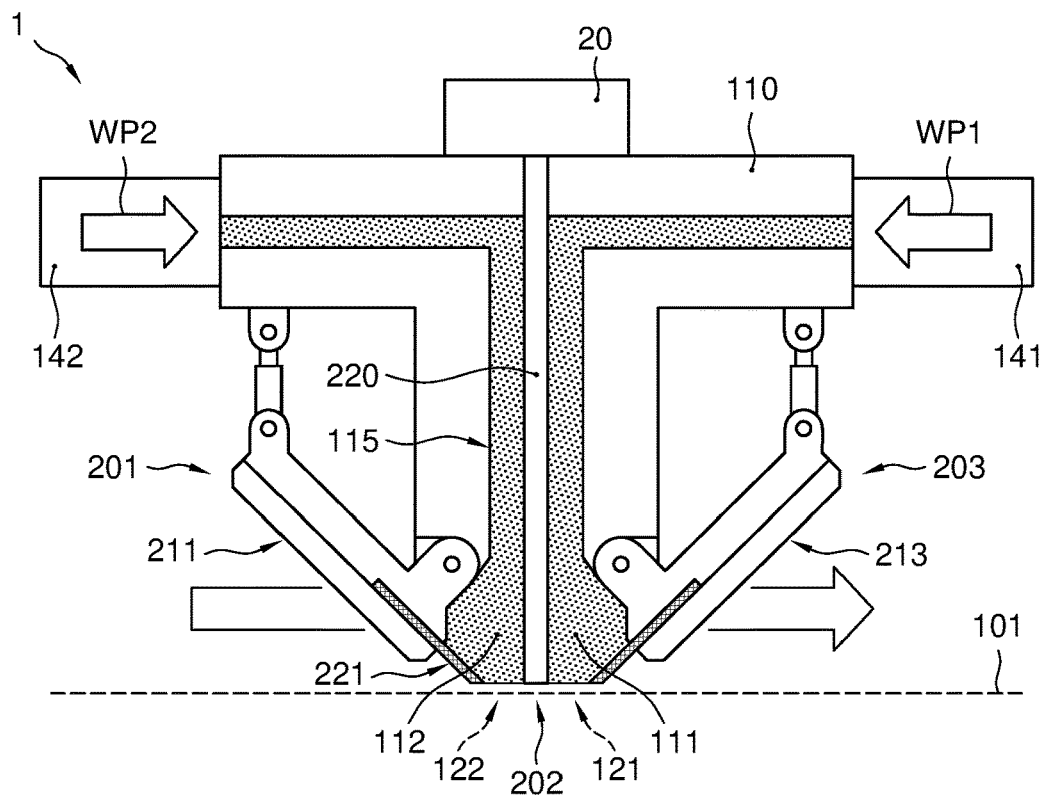
FIG. 1B illustrates a cross section sideview of a deposition system in open condition.

The deposition system for depositing a printable medium will now be elucidated with reference to FIG. 1, wherein FIG. 1A illustrates a cross section sideview of deposition system 1 in closed condition and FIG. 1B illustrates a cross section sideview of deposition system 1 in open condition. For ease of understanding some particulars to the deposition of the printable medium will be explained in more detail later. As shown in FIGS. 1A and B, the deposition system comprises a deposition head 100. The deposition head 100 at least includes a first deposition chamber 111 that is at least in part defined by a recess 115 in the main body and that extends to a first orifice 121 in the deposition face 101 (see dashed line) between at least two shutter elements 201, 202. The orifice can be reversibly opened and closed. Depending on a use condition, e.g. working pressure, the distance (or length) along which the orifice is opened can be tuned. Provided to the system is at least a first pressurizing mechanism 141 and a drive unit 20 for providing relative motion between the deposition head and the workpiece in a direction transverse to the surface of the workpiece. Pressurizing mechanism 141 acts on the first deposition chamber and is configured to, in use, apply a first working pressure WP1 onto a printable medium 2 contained in the first deposition chamber. Typically, the system also includes a means for providing relative motion between the deposition head 100 and the workpiece in a lateral direction along the surface of the workpiece. Said means can be included in the system, e.g. as a conveyor. Alternatively or in addition, the drive unit 20 may be arranged to provide lateral motion. Optionally, the deposition system may be used in combination with a further system, e.g. a production line, that already includes a conveying means.

Said at least two shutter elements 201, 202 include a first shutter element 201. The first shutter element comprises a first blade 221 that extends from a first mount 211 towards an other 202 of the at the least two shutter elements so as to, in closed condition, close the first orifice 121 between terminal ends of the first blade and the other of the at least two shutter elements. Said first blade 221 is configured to flex in response to an applied first working pressure to at least partly open the first orifice 121. Opening the orifice, e.g. upon application of working pressure, allows the medium 2 to exit the deposition chamber and to flow towards the workpiece.

As shown, the first shutter element 201 together with the other 202 of the at the least two shutter elements can be understood as a mechanism for reversibly closing and opening the deposition chamber. Providing the deposition system 1 with a closing mechanism advantageously mitigates spilling or leaking of printable medium 2 from the deposition head 100, e.g. onto non-target deposition areas on a workpiece, while the system is in an idle state. In idle condition the pressure on the printable medium 2 is kept relatively low, similar to ambient, so that the deposition chamber 111 stays closed. Additionally, the shutter elements can be provided with a means to maintain a closed position by applying a closing force. Suitable means include but are not limited to springs, pneumatic cylinders, solenoids, etc.

As will be explained in more detail in relation to FIG. 2 the drive unit 20 is arranged to, in use, adjust a relative position between the main body 110 and the surface of the workpiece to maintain a flush contact between the surface of the workpiece and the terminal ends of the first blade 221 and the other 202 of the at least two shutter elements while in a flexed condition. Maintaining a flush contact during a deposition run restricts a lateral flow of the printing medium along the surface of the working piece, e.g. beyond the blade.

In some embodiments, e.g. as shown in FIG. 1A, the other of the at least two shutter elements 202 comprises a further blade. Said further blade extends towards the terminal end of the first blade 221 from a corresponding mount provided to the main body opposite the first mount across the recess. Preferably, said further blade is also configured to flex in response to an applied first working pressure so as to contribute to at least partly opening the first orifice 121. Alternatively, the other of the at least two shutter elements 202 can be a static shutter element, e.g. a protrusion such as a wall section or even an opposing edge of the recess 115. As such the first deposition chamber 111 can be understood to be closed off by a single blade.

Figure 2A:
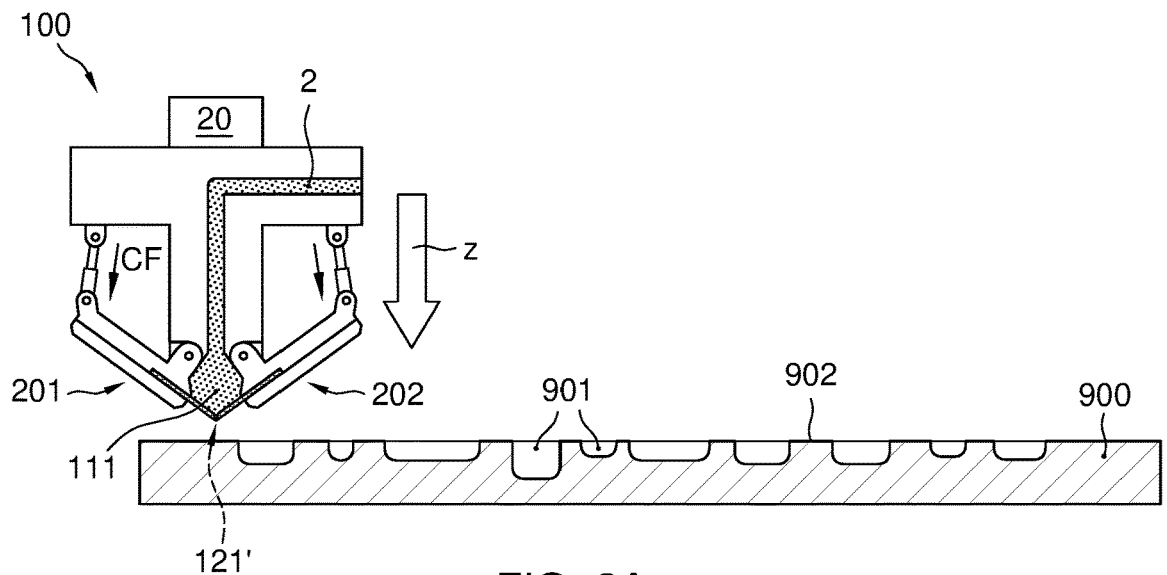
FIG. 2 (A, B, C) illustrates a deposition system in use.
Figure 2B:
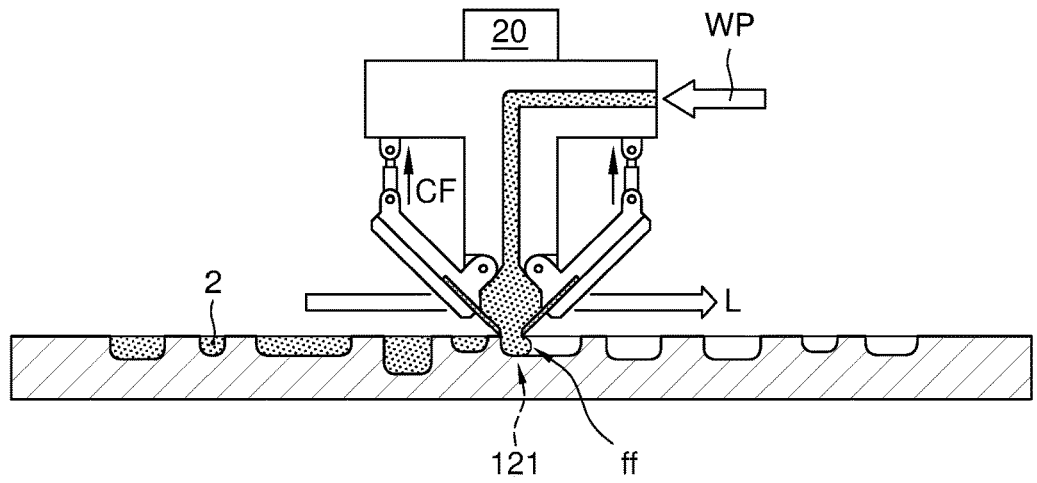
Figure 2C:
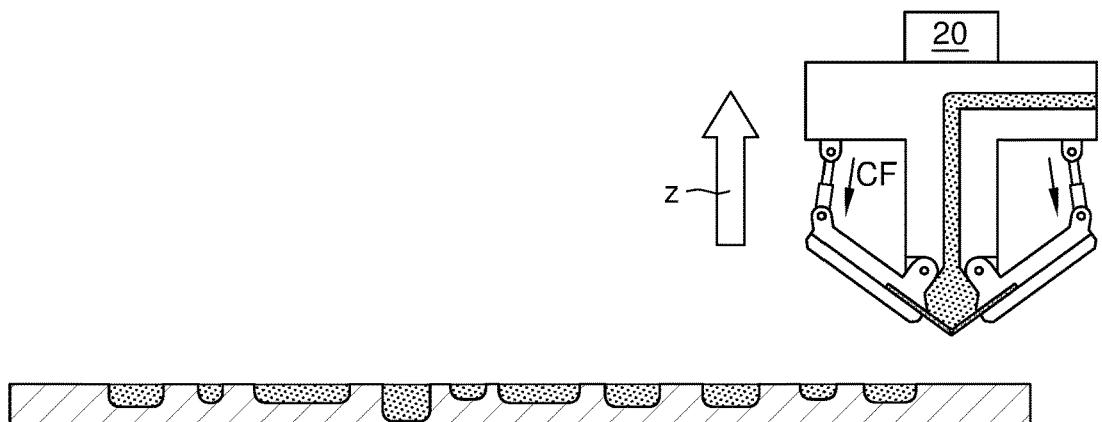

FIG. 2 illustrates aspects of a deposition system in use to fill grooves 901 provided in the surface 902 of in a workpiece 900. So as to ease understanding some parts, such as the pressurizing mechanism, are not depicted. FIG. 2A depicts a deposition head 100 while in idle condition. The first deposition chamber 111 is filled with printable medium 2. The orifice is in a closed conduction 121'. Before opening the orifice, the deposition head 100 is moved in a direction "z" transverse to the surface 902 of the workpiece. The pressure on the ink 2 is kept relatively low so that the terminal ends of the first shutter element 201 and the other 202 of the at least two shutter elements remain in contact. Typically a closing force CF is applied to assure the orifice is in a closed conduction 121'. When the blades contact the workpiece the closing force, if applied, is released and the pressure working pressure WP on the ink is increased so as to flex the blade and switch the orifice to an open condition 121. If required, the control unit adjusts a vertical position so that the orifice can be opened while the terminal ends of the shutter elements remain in contact with the workpiece.

As the orifice is opened the ink 2 can be forced into the groove. The resulting force, including the pressure exerted onto the workpiece as the printable medium 2 is ejected from the orifice 121, will make the system want to lift from the workpiece. This is counteracted by the drive unit 20 by suitably adjusting a relative position between the main body and the surface of the workpiece so as to maintain a flush contact between the surface of the workpiece and the terminal ends of the first blade 221 and the other 202 of the at least two shutter elements while in a flexed condition.

In some embodiments, the drive is arranged to adjust the relative position between the main body and the surface of the workpiece in dependence of a measured force between the deposition head 100 and the workpiece. To this end the system can be provided with a suitable force sensing means such as a force gauge 30 or pressure sensor. The output of said means can be used as control parameter to maintain the flush contact. In other or further embodiments the drive unit is further arranged to adjust an angle between the deposition head and the workpiece such as to maintain the flush contact, e.g. with a tilt, or θ-stage.

As shown in FIG. 2B, the flush contact is maintained as the head 100 is guided across the surface of the workpiece (lateral motion L). Provision of a flush contact, at least during a deposition run can be understood to contribute to confining a flow of the medium from the head into the groove, mitigating deposition of material outside the groove.

Ink being forced into the groove as the head is passed across the groove creates a filling front "ff" that pushes air out of said groove in a direction along with the lateral motion "L" (in front of the terminal end of shutter element that is leading the direction of lateral motion L). Pushing the air in front of the terminal end of the leading shutter element mitigates incomplete filling of the groove due to entrapment of air bubbles, which can occur with methods wherein a quantity of ink is pushed in front of a terminal end of a leading blade while passing across the groove, such as with doctor blading.

Alter completing the filling procedure, the head 100 is retracted from the workpiece 900. Preferably, the orifice is closed prior to breaking the flush contact. Closing the orifice may be attained by one or more of applying a closing force CF to the shutter elements and by applying a suitable under pressure. Closing the orifice prior to breaking the flush contact can, in particular for pasty products which are generally very sticky, mitigate deposition of residues as the head is pulled away from the workpiece.

The applied working pressure depends on the viscosity of the printable medium 2 and/or on the geometry of the grooves that are to be filled and can be determined experimentally. High aspect ratio grooves (width/depth>1) typically require higher working pressure compared to low aspect ratio grooves. Typically, the applied working pressure can be as large as 7 bars or more, e.g. in a range between ambient and 6 bars or more, e.g. up to 10 bars or even more, e.g. up to 24 or 30 bars as possible with some syringe systems. Note that at increasingly high pressures shorter and/or thicker blades may be preferred to limit flexing of the blades. An upper limit can be determined by a strength of the used shutter elements, e.g. the first blade.

Figure 4:
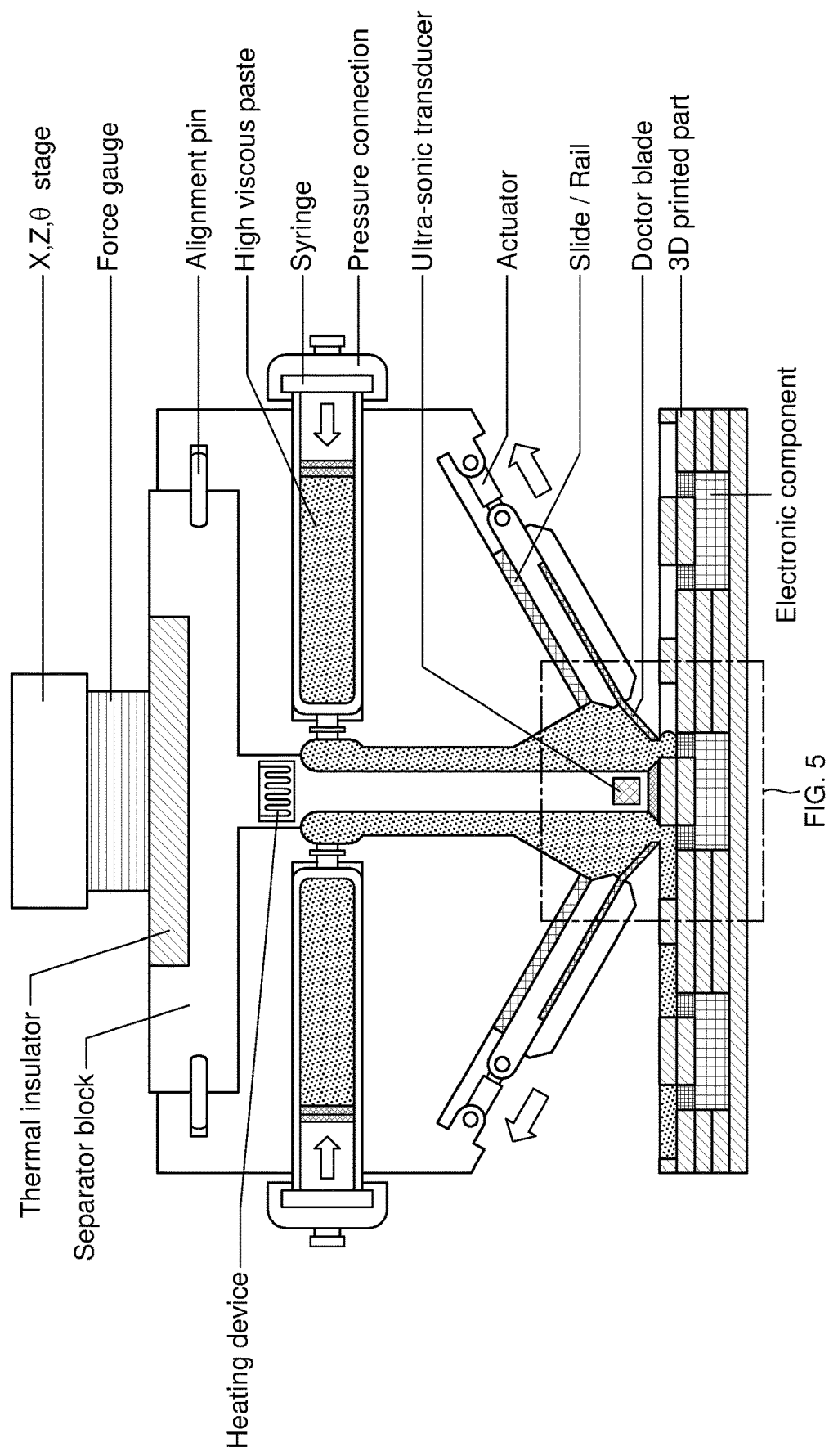

Heat can be provided to reduce the viscosity of the printable medium. Preferably, the system comprises a heater 180 at a position so as to locally act on the printable medium 2 contained in the deposition chamber, e.g. as shown in FIGS. 3 and 4. Heating the printable medium 2 can reduce the viscosity of the ink and can accordingly increase a deposition rate at a given working pressure. The upper limit of the target temperature depends on the thermal stability of the printable medium, e.g. a boiling temperature and/or decomposition temperature of one or more of its constituents. For highly loaded paste the upper limit is typically between 80 and 100° C. Accordingly, the ink is typically heated to a temperature between 30 and about 100° C., e.g. between 40 and 80° C. or between 30 and 70° C.

In a preferred embodiment, e.g. as shown in FIGS. 3 and 4, the other 202 of the at least two shutter elements includes a separator wall 220. The separator wall 220 extends longitudinally through recess 115 to define a second deposition chamber 112 that is laterally separated from the first deposition chamber 111 by said separator wall 220, or in other words to define a dual chamber system. As shown, the first and second mount are typically provided along opposing edges of the recess 115, wherein each of the mounts covers a corresponding orifice.

Typically, such dual chamber system, as shown in FIGS. 1B and 3, further comprises a second pressurizing mechanism 142 that acts on the second deposition chamber, and that is configured to, in use, apply a second working pressure onto a printable medium contained in the second deposition chamber. As shown, said second deposition chamber 112 extends to a second orifice 122 in the deposition face 111 between the other 202 of the at least two shutter elements and a further shutter element 203. FIG. 3 illustrates shutter elements in closed position, i.e. with the first orifice 121' and the second orifice 122' in closed condition. Said further shutter element 203 comprises a second blade 223 that extends from a corresponding second mount 213 that is provided to the main body 110 opposite the first mount 211 across the recess 115 towards the other of the at least two shutter elements 202 to close the second orifice between terminal ends of the second blade and the other of the at least two shutter elements in a closed condition. Similar to the first blade, said second blade is preferably configured to flex in response to an applied second working pressure so as to at least partly open the first orifice.

The dual chamber system advantageously provides two orifices from which medium can be deposited into a groove. The separator wall 220 separating the first and second deposition chambers advantageously allows application of a second working pressure which is essentially independent from the first working pressure and vice versa. Applying different working pressures was found to offer a number of benefits, which includes optimized filling.

As described above in relation to FIG. 2, fill speed can be increased by increasing the working pressure. In comparison to single chamber systems dual chamber systems advantageously allow more freedom in selection of working pressure that can be applied. A main aspect hereto is based on a realization that due to an experienced difference in flow resistance the functional paste 2 will flow more readily into wide grooves as opposed to narrow grooves. The means that, in particular for workpieces comprising a plurality of grooves with, a system operating under a single working pressure, can lead to uneven filling of grooves, e.g. wide grooves potentially being overfilled compared to narrow grooves. To mitigate this, e.g. to mitigate inhomogeneities in the filling level of differently dimensioned grooves, it can be considered to deposited the ink using only a slight overpressure as compared to ambient. However, use of a slight overpressure, necessarily reduces a flow rate and thus limits the speed at which the head can be moved across the grooves, thus increasing the overall time required to process the workpiece.

Advantageously, provision of a dual chamber system can mitigate these aspects by using different working pressures in the chambers. Thus allowing to increase a fill speed while maintaining or even improving control over the fill level. During use the two chambers are passed sequentially across the groove. The first chamber, the leading chamber, is operated at a comparatively high pressure, e.g. 6 bars overpressure, so as to at least provide an initial fill to a groove at a high deposition rate. The second chamber, the trailing chamber, operates at a comparatively lower pressure, e.g. 1 bar overpressure, so as to complete the filling of the groove. The second blade, the trailing blade can function as a scraper controlling a fill.

Preferably, the orifices are spaced across a relatively short distance yet sufficiently far apart to allow simultaneous filling of a single groove from both orifices while operating under mutually different working pressures. Larger separation distance between first and second orifices improves decoupling of pressure (reduces coupling across the groove). At smaller separation distances a pressure drop between the two chambers can be reduced, e.g. via a percolation path along a groove to be filled, which may partly negate the benefits of using a dual chamber system. To mitigate cross coupling when the dual chamber system passes across a groove, the area of the separator wall separating the chambers, as seen from the workpiece, preferably exceeds the cross-sectional area of the groove (as seen along the groove) by a factor of at least two, preferably by at least ten. In a preferred embodiment, the first and second orifice are laterally separated from each other by a distance more than a maximum depth of the grooves to be filled and less than a minimal lateral width a depth of the grooves to be filled. The separation distance is typically defined by the thickness of the separator wall. Typically the separator wall has a width in a range between 1 and about 10 millimeters. Separator walls having a width in this range were found to reliably fill a broad range of grooves having dimensions in a relevant range.

As shown, each of the at least a first blade is positioned under an acute angle relative to the surface of the workpiece. Preferably, the angle is a range from 15 to 60 degrees, most preferably in a range from 20 to 35 degrees. Angles in the specified ranges were found to offer a good balance between pressure applied onto the workpiece and confinement e.g. wiping or scraping of medium to be printed.

The working pressure can in principle be adjusted over a broad range to affect a deposition rate. While not in flush contact with the workpiece increasingly high working pressures results in increasingly larger deflection of the blade, whereby the increasing outward displacement of the tip of the blade results in an increasing distance over which the orifice is opened. However, while already in flush contact, increasing the working pressure can result in increasing the contact pressure between tip and the workpiece. Increasing contact pressure can increase wear of blades and/or scratching the surface of the workpiece, e.g. during a lateral translation of the deposition head across the surface of the workpiece.

As the system and thus the bladed are typically used at different operating temperatures, and/or in combination with printable media with a potentially broadly varying composition, the blades are preferably resilient blades so as to mitigate a need for frequent replacement of the blades. Blades formed of a plastic composition were found to offer a suitable combination of properties including strength, stiffness and toughness. Blades formed of a composition comprising a polyaryletherketone (PAEK) polymer such as PEK (polyetherketone), PEEK (polyether ether ketone), PEKK (poly(etherketonketone)), PEEKK (poly(etheretheretherketone)), PEKEKK (poly(etherketon-etherketonketone)) or mixtures thereof were found to be particularly suitable as such blades combine low friction (low-stick), suitable strength, stiffness and toughness. Advantageously, the properties of these polymers remain stable or at least predictable at elevated temperatures up to 200° C. Particularly preferred compositions include PEEK.

In strongly preferred embodiments, the first mount is arranged to, in use, adjust a position and/or orientation of the first blade relative to the main body in dependence of at least the first working pressure. Adjusting a position and/or orientation of the first blade, relative to the main body, can be understood to include providing a rotational and/or translation motion of the first blade relative to the main body. Adjusting a position and/or orientation of the first blade advantageously can be understood to constitute a means of opening and closing the closing mechanism, i.e. to contribute to controlling an opening width of the orifice, e.g. during a deposition procedure while maintaining flush contact with the workpiece.

It will be appreciated that excessive contact force between the shutter elements and the workpieces is preferably avoided so as to mitigate wear to the shutter elements and/or the workpieces. Excessive contact force between the shutter elements and the workpieces is particularly disadvantageous when using comparatively soft shutter blades, such as plastic blades, and/or with a comparatively soft workpiece such as a plastic substrate, such as PCBs, or even 3D-printed parts such as an exemplary workpiece 900 depicted in FIGS. 4 and 5 that is built from a plurality of layers 900*a*, 990*b*, 990*c*, 900*d*, and 900*e*. As shown, the deposition head 100 is used to deposit a conductive past 2, in grooves so as to form electrically conductive contact pads to contacts 905 of a buried electronic device 904. Advantageously, systems comprising a first mount that is arranged to, in use, adjust a position and/or orientation of the first blade relative to the main body in dependence of at least the first working pressure, allow maintaining the contact pressure below a predefined maximum contact pressure. For comparatively soft workpieces and/or systems with blades comprising a plastic composition such as described above inventors found that the contact pressure between tip of the blade and workpiece is preferably kept below about 0.5 bar, preferably in range between 0.1 and 0.4 bar, most preferably about 0.2 or 0.3 bar.

To maintain minimal contact pressure between the surface of the workpiece and the terminal end of the blade the device and in particular the first mount is preferably further arranged to in use adjust the position and/or orientation of the first blade in dependence of at least the first working pressure, so as to in use at least partly counteract said contact pressure between the terminal end of the first blade and the surface of the workpiece. Adjusting the position and/or orientation of the first blade in dependence of at least the first working pressure advantageously allows reducing the contact pressure, thus mitigating excess contact pressure between tip and workpiece.

Figure 6A:
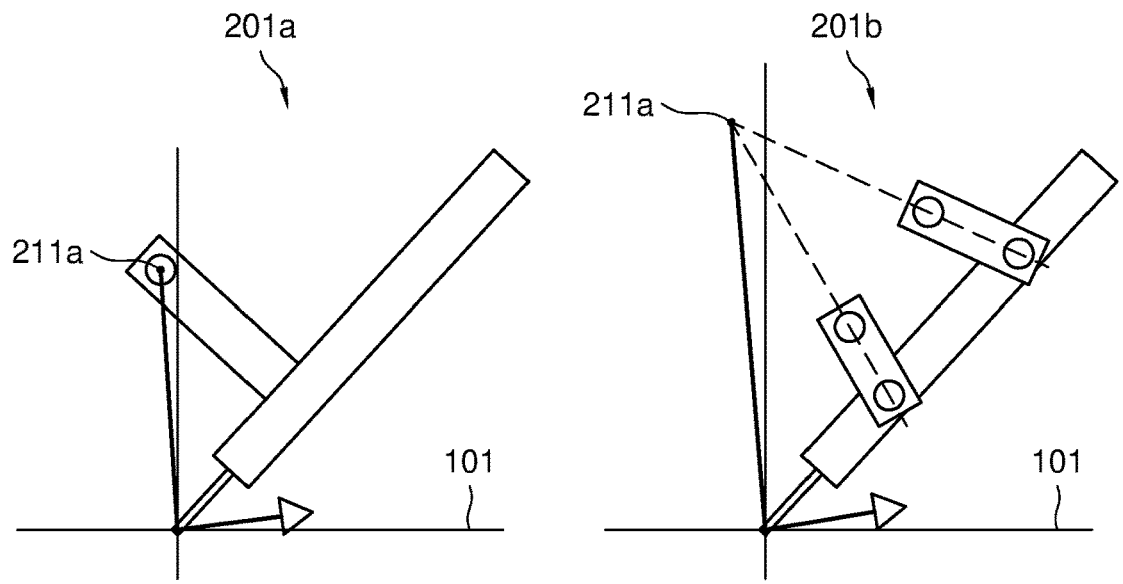
FIG. 6A illustrates embodiments of shutter elements.

Counteracting the contact force can be attained in a number of ways which will be elucidated in more detail with reference to FIG. 6, in which FIG. 6A illustrates two embodiments of a first shutter element 201*a* and 201*b*. In both embodiments the mount is arranged to be rotatable around an axis 211*a* so that the tip of the blade can be pulled away from a closing position without imparting a motion of the tip end towards the workpiece, e.g. across the deposition face 101. In embodiment 201 the axis of rotation is provided near a terminal end of an arm extending beyond the tip of the blade. Embodiment 201b illustrates an alternative mount arranged to rotate along a virtual axis.

Figure 5:
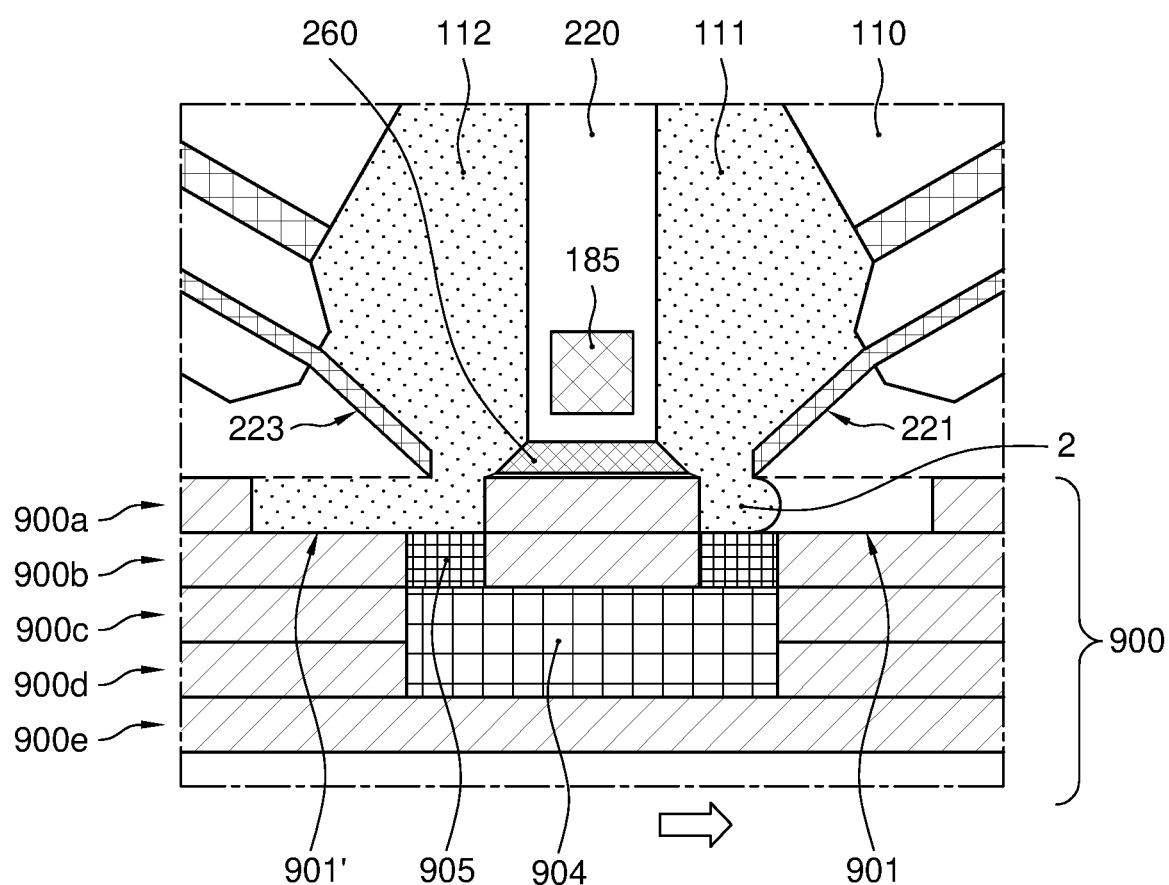
FIG. 5 illustrates a detail view of a deposition system in open condition.
Figure 6B:
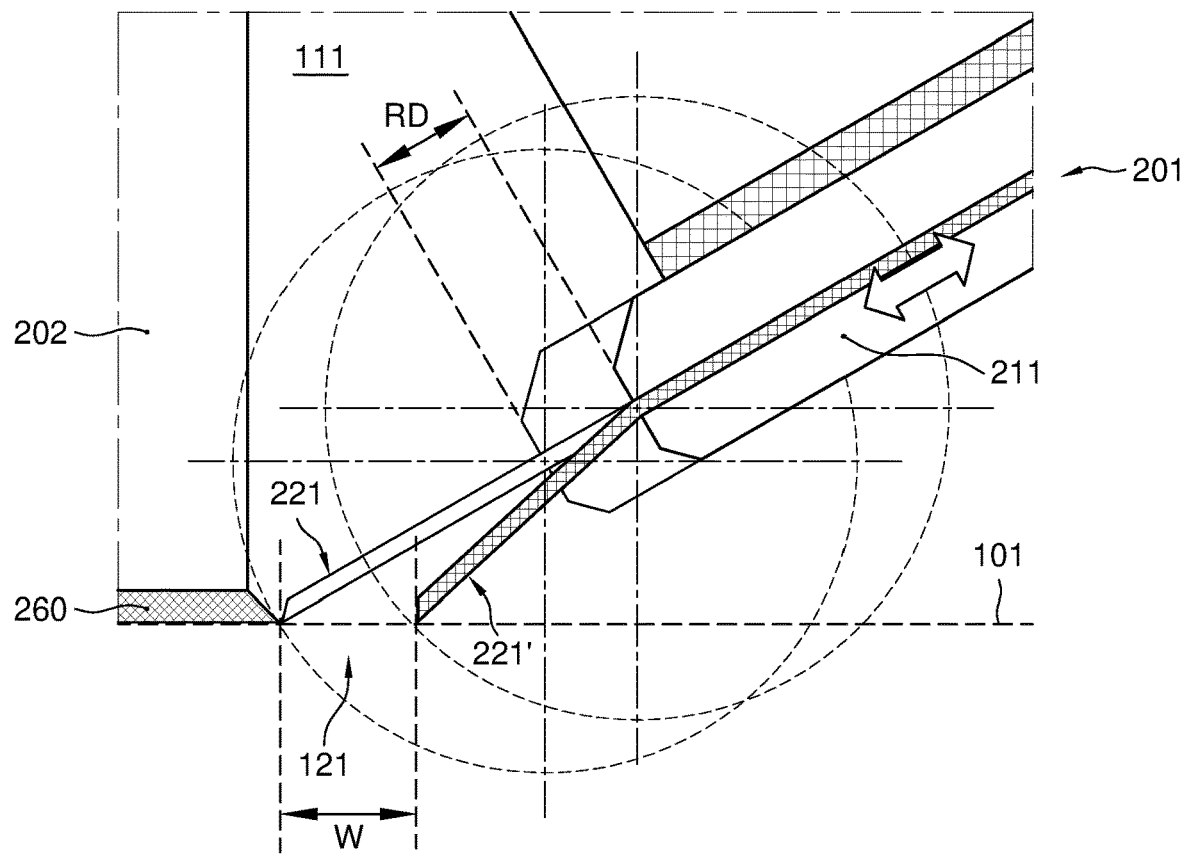
FIG. 6B illustrates a shutter element in closed and open condition.

In a strongly preferred embodiment, e.g. as shown in FIGS. 3-5 and 6B the first mount 211 comprises a retracting mechanism arranged to, in use, retract the corresponding blade 211 in a direction along said blade. FIG. 6B illustrates a mount with blade 221 in an idle position and in a position under operating conditions. In the idle position the blade contacts a terminal end of an opposing other shutter element 202. In the open position the blade is retracted by a distance RD to a retracted position 221'. Also illustrated is flexing of the blade in the retracted position under influence of a working pressure applied to an ink in the first deposition chamber 111. Preferably, the blade is retracted in dependence of the applied working pressure so as to avoid motion of the tip of the blade across the deposition face 101, thus mitigating contact force between blade and workpiece while maintaining flush contact. It will be understood that the opening width W of the orifice depends on sliding distance and working pressure (flexing distance of the blade).

In some embodiments, sliding and/or rotational motion of the blade is controlled in dependence of pre-determined calibration values. Preferably, the system includes a controller, e.g. a feedback controller, such as a force feedback controller acting on one or more of the first and second mounts to adjust a position and/or orientation of one or more of the terminal ends of the blade relative to the main body.

In some embodiments, e.g. as shown in FIGS. 5 and 6B, the deposition system comprises a sliding element 260 that is provided at the terminal end of the other of the at least two shutter elements (the separator wall). The sliding element 260 extends along the deposition face 101 and is arranged to, in closed condition, contact terminal ends of the first and the second shutter elements (blades) along opposing terminal ends of said gliding element. The sliding element advantageously provides an elongate contact face for in use contacting and sliding along the surface of the workpiece. The sliding element can be understood to, in use, reduce a contact pressure between system and workpiece. Preferably, the elongate contact face comprises, or is formed of, a low friction and/or wear resistant material, e.g. a coating, such as polymer composition comprising a polyfluorinated polymer such as polytetrafluoroethylene (PTFE), nylon, and/or polyaryletherketone (PAEK).

Figure 7A:
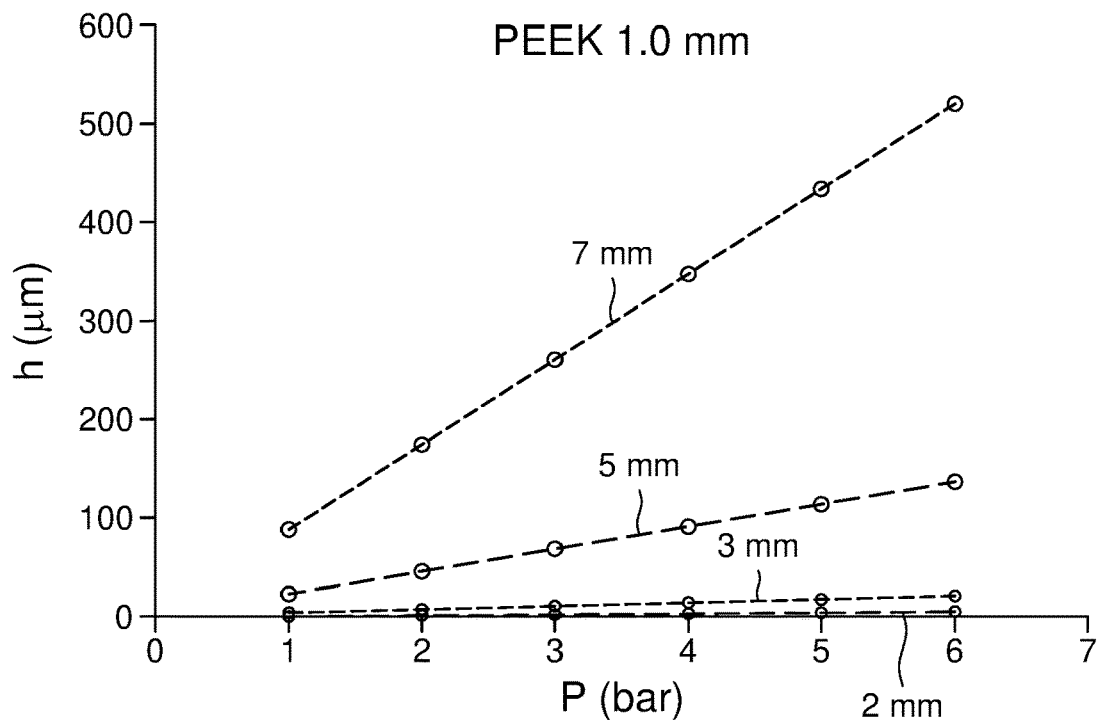
FIGS. 7A and B illustrate bending of blades as function of pressure.
Figure 7B:
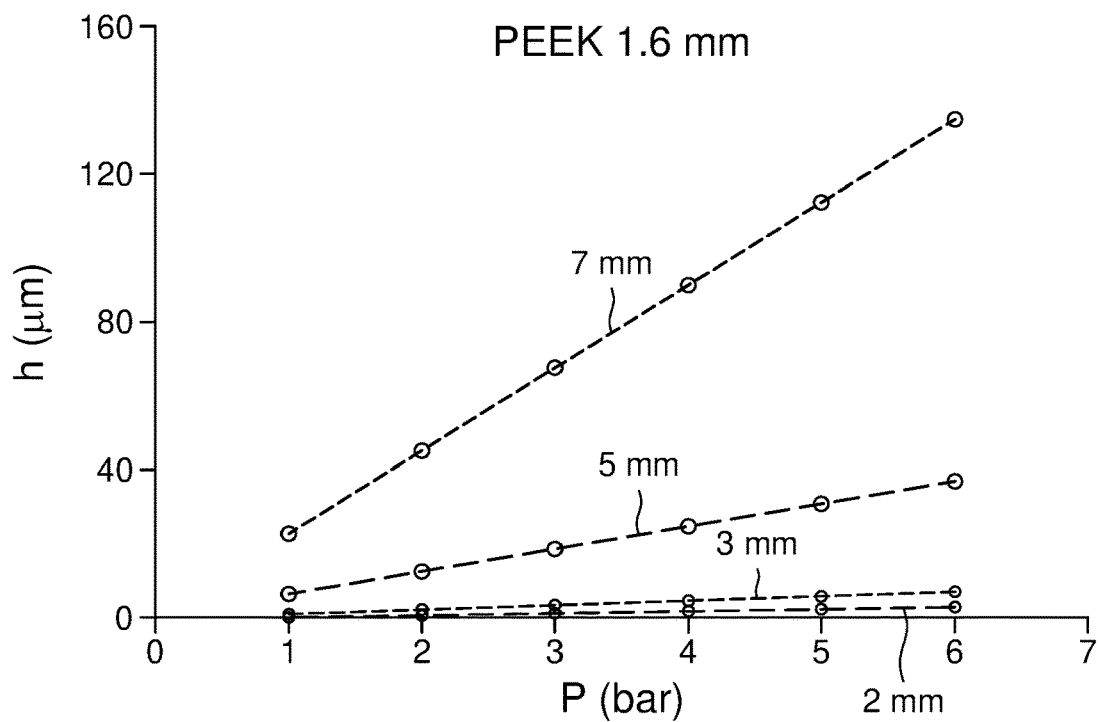

Typically, blades have a thickness in a range between 0.5 and 3 millimeters and a length (arm) between mount and tip in a range from about 1.5 to 10 millimeters. FIG. 7 illustrates bending of typical PEEK blades having a length (arm between mount and tip) between 2 and 7 millimeters in dependence of applied pressure at room temperature. FIG. 7A depicts a determined flexing distance of the tip 'h' for PEEK blades with a thickness of 1 millimeter. FIG. 7B illustrates bending of otherwise similar blades but having a thickness of 1.6 mm. As can be seen flexing distance was found to scale linearly with the applied pressure. Advantageously, the highly predictable behavior was found even at elevated temperatures, such as the preferred operating temperatures as described above.

Figure 8:
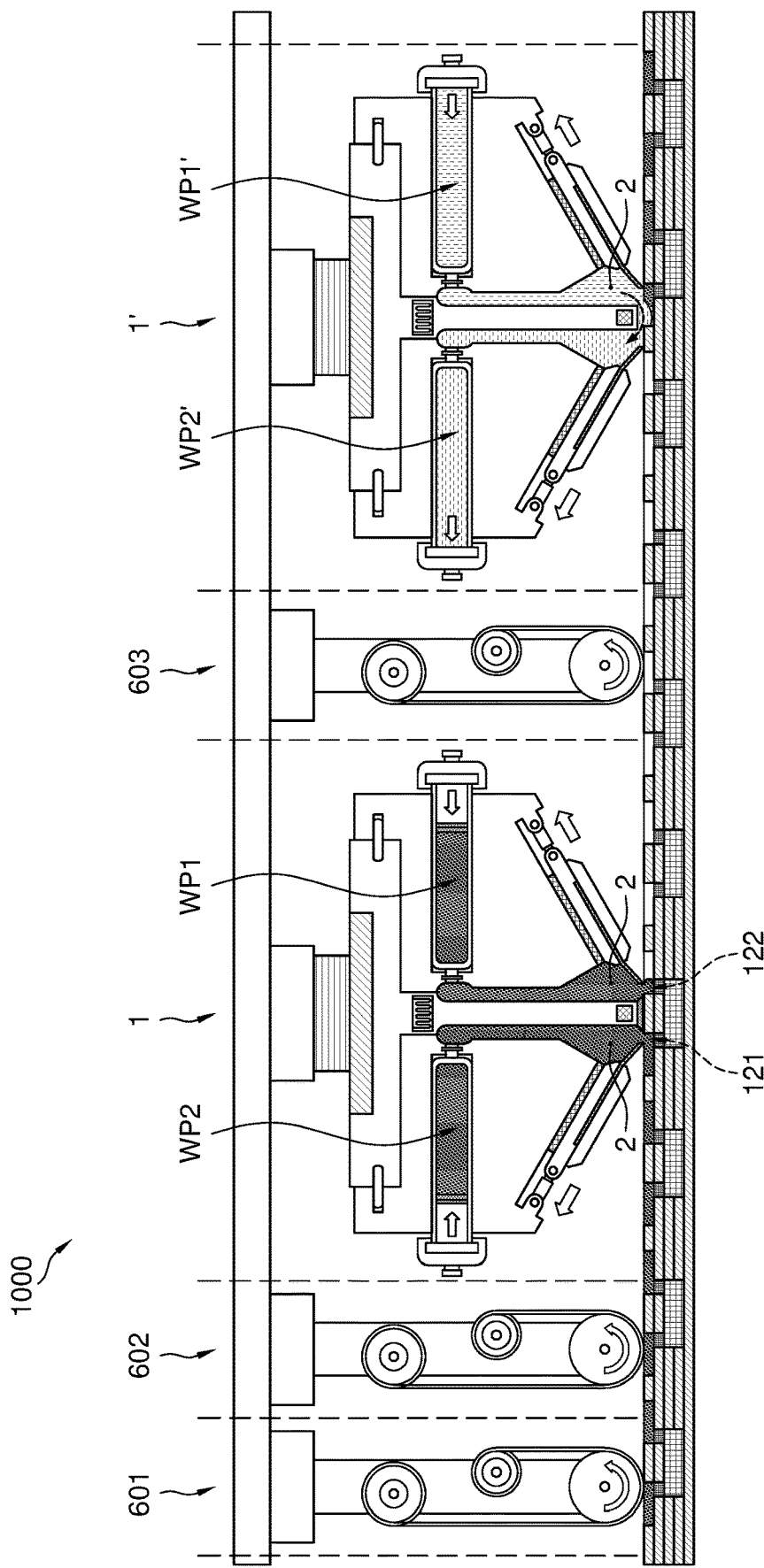
FIG. 8 illustrates a deposition system assembly.

In some embodiments, the deposition system comprises an ultra-sonic transducer 185. Said transducer is preferably provided near the workpiece, e.g. at a terminal end of the separator wall or embedded therein, e.g. as shown in FIGS. 4 and 5. Positioning the ultra-sonic transducer near the workpieces allows the transducer to, in use, act on the printable medium deposited within the groove. Sonication can reduce bubble formation within the groove. More importantly, the transducer can contribute to a cleaning operation mode, as will be described in more detail in relation to a deposition system assembly as shown in FIG. 8.

Advantageously, the disposition system as disclosed herein can also be used to deposit low viscosity inks and/or cleaning agents, including but not limited to organic solvents such as ethanol, propanol and acetone. Cleaning agents can advantageously be used to clean surfaces and/or grooves, in particular when combined with sonication. To avoid dissolved contaminates from being redeposited on the workpiece, e.g. upon solvent evaporation, the solvent is preferably removed, e.g. sucked up, from the workpiece. As shown in FIG. 8 a dual deposition chamber system can be used with this effect to particular benefit. Illustrated in FIG. 8 is a system 1' in use to deposit a cleaning agent 2' from one of the first and the second deposition chambers and to at least partly recover said cleaning agent via the other of the first and the second deposition chambers. Depositing and subsequent removal of the cleaning agent 2' can be attained by applying a positive working pressure WP1' to one of the corresponding deposition chambers and applying an under pressure WP2' to the other of the corresponding deposition chambers.

According to a further aspect, the present disclosure relates to a deposition system assembly. FIG. 8 illustrates an exemplary assembly 1000. The assembly 1000, e.g. as shown, is arranged to subsequently deposit: a cleaning agent to clean the grooves provided within a surface of a workpiece; and a high solid content printable medium to fill said cleaned grooves. To this end said system comprises at least two deposition systems as disclosed herein that are arranged in series. At least one, preferably both, of the systems is a dual deposition chamber system. Preferably, one of the systems is arranged to deposit and remove a cleaning agent. The other is arranged to deposit a printable medium 2, e.g. a high solid content paste, in the cleaned groove. Optionally, the deposition system assembly can be provided with one or more cleaning systems, e.g. wiping systems 601, 602, 603, arranged to selectively remove at least part of an amount of printable medium deposited outside the grooves. For example, the assembly can include one or more of a wiper or blower positioned between the cleaning and filling unit to remove remaining residues of cleaning agent 2' from the workpiece. Alternatively, or in addition, the assembly can include one or more wipers to remove traces of printable medium 2 left on the of the workpiece at a landing/retraction position and/or a wiper arranged to remove traces of printable medium deposited along edges of the workpiece.

According to yet further aspects, the present disclosure relates to a method of depositing a printable medium in grooves and to s use of the disclosed system. The method of depositing a printable medium in grooves provided within a surface of a workpiece comprises at least the steps of: providing a deposition system as disclosed herein; applying a first working pressure onto a printable medium contained in the first deposition chamber to flex the first blade to at least partly open the first orifice, and providing a relative motion between the main body and the workpiece in a direction transverse to the surface of the workpiece so as to maintain a flush contact between the surface of the workpiece and the terminal ends of the first blade and the other of the at least two shutter elements; and the step of providing a relative motion between the deposition head and the workpiece in a lateral direction along the surface of the workpiece to guide the deposition head across the grooves.

Preferably, the system is of the dual chamber type. Accordingly, and in line with the description of such dual chamber systems, the method further comprises: applying a second working pressure onto a printable medium contained in the second deposition chamber to flex the second blade to at least partly open the second orifice while applying the second working pressure. Preferably, the first working pressure is higher than the second working pressure if the first orifice is leading and the second orifice is trailing (as seen along the direction of lateral motion) when the deposition head is guided across the grooves, or wherein the second working pressure is higher than the first working pressure if the second orifice is leading and the first orifice is trailing.

Figure 9:
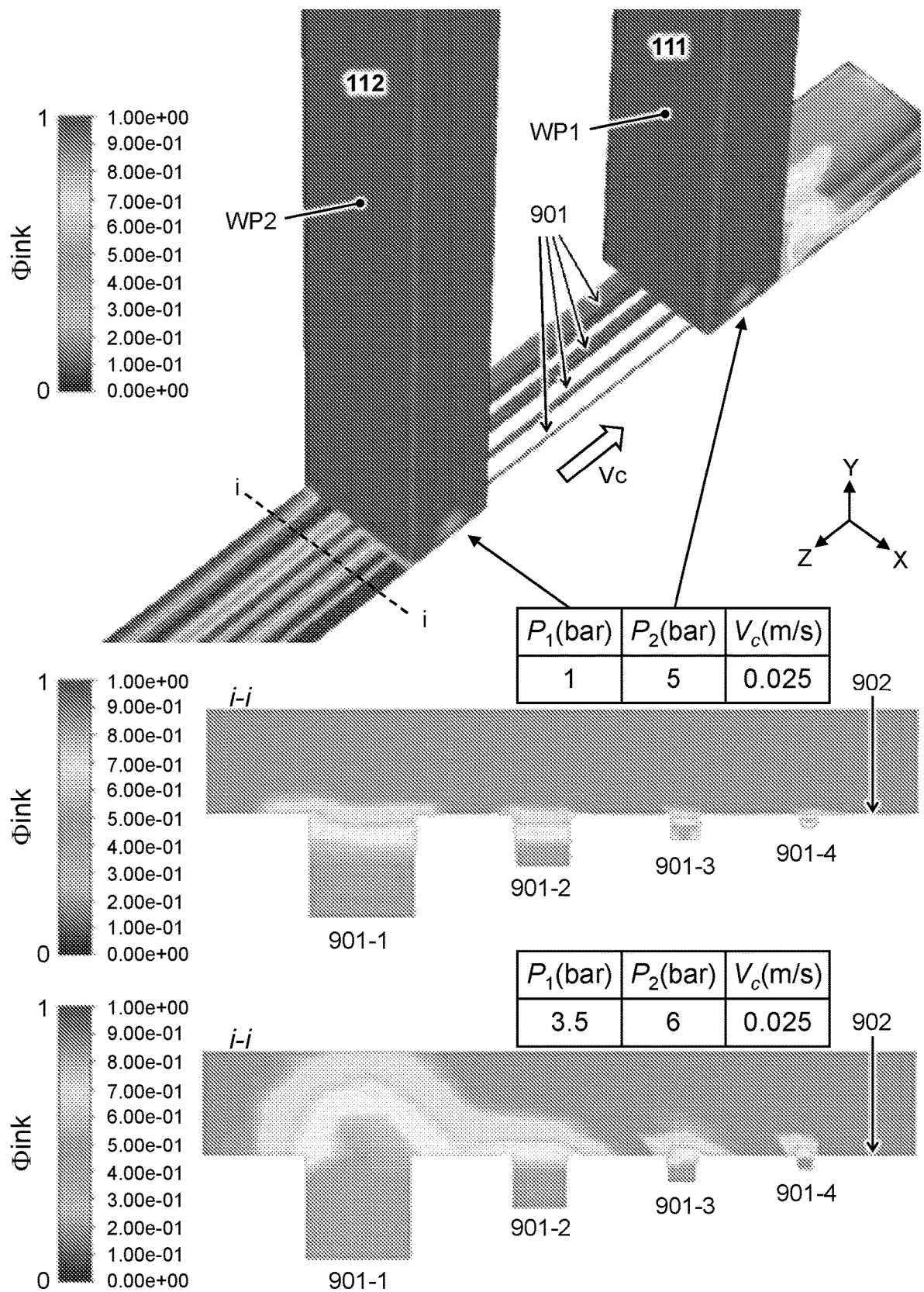
FIG. 9 illustrates filling of a groove.

FIG. 9 illustrates experimental results of exemplary grooves 901-1 to 901-4 provided in a workpiece filled using a dual chamber system as disclosed herein. Depicted are first and second deposition chambers 111, 112, each filled with a printable medium having a viscosity of 1000 Pa·s and a thixotropic index of 4. The system is in flush contact with the workpiece. Other parts of the system such as the blades are omitted for ease of understanding. The system is moved across the workpieces at speed Vc in direction indicated by the corresponding arrow. The working pressure WP1 (P1) in the leading working chamber 111 (in the direction of motion) is higher than the pressure WP2 (P2) in the trailing chamber 112. As the chambers pass across the groove, printable medium 2 (paste) is forced into each groove. As can be seen, the paste is selectively deposited into the grooves; essentially no ink is deposited on areas of the surface 902 of the workpieces next to the grooves. The two cross-section views below illustrate the filling level. The upper cross-section image pertains to a run performed wherein the working pressure in the leading chamber WP1 was set at 6 bars (overpressure) and the pressure at the trailing chamber WP2 was set at 1 bar overpressure. For the lower cross-section image WP2 was changed to 3.5 bars. In both cases the velocity was 0.025 m/s. As can be seen changing the working pressure in the trailing chamber has a pronounced effect on filling level, enabling control over the filling level and even enabling essentially complete filling of the grooves in a single pass.

In another or further preferred embodiment, the system provided includes a first mount comprising a retracting mechanism arranged to in use retract the corresponding blade in a direction along said blade method according comprising. Accordingly, the method can be understood to include the step of retracting the first blade in a direction along said blade to at least partly counteract a contact pressure between the terminal end of the first blade and the surface of the workpiece. As explained in relation to the system, retracting the first blade can be understood to contribute to opening the orifice and to reducing a contact pressure between workpiece and blade.

Typically the methods include a step of closing the one or more orifices. Closing the orifice, e.g. after completing a deposition cycle typically includes at least reducing the applied working pressure so as to stop ejecting of printable medium. Typically, the step of closing the one or more orifices comprises repositioning the first blade to an idle, closing position. Positioning the blade to a closing position typically comprises reversing a applied retraction distance. Alternatively, or in addition, closing the orifice can include applying an under pressure to the corresponding working chamber. Independent of the type of material deposited, the step of closing the opened first and/or second orifice is preferably performed prior to breaking the flush contact.

Figure 10:
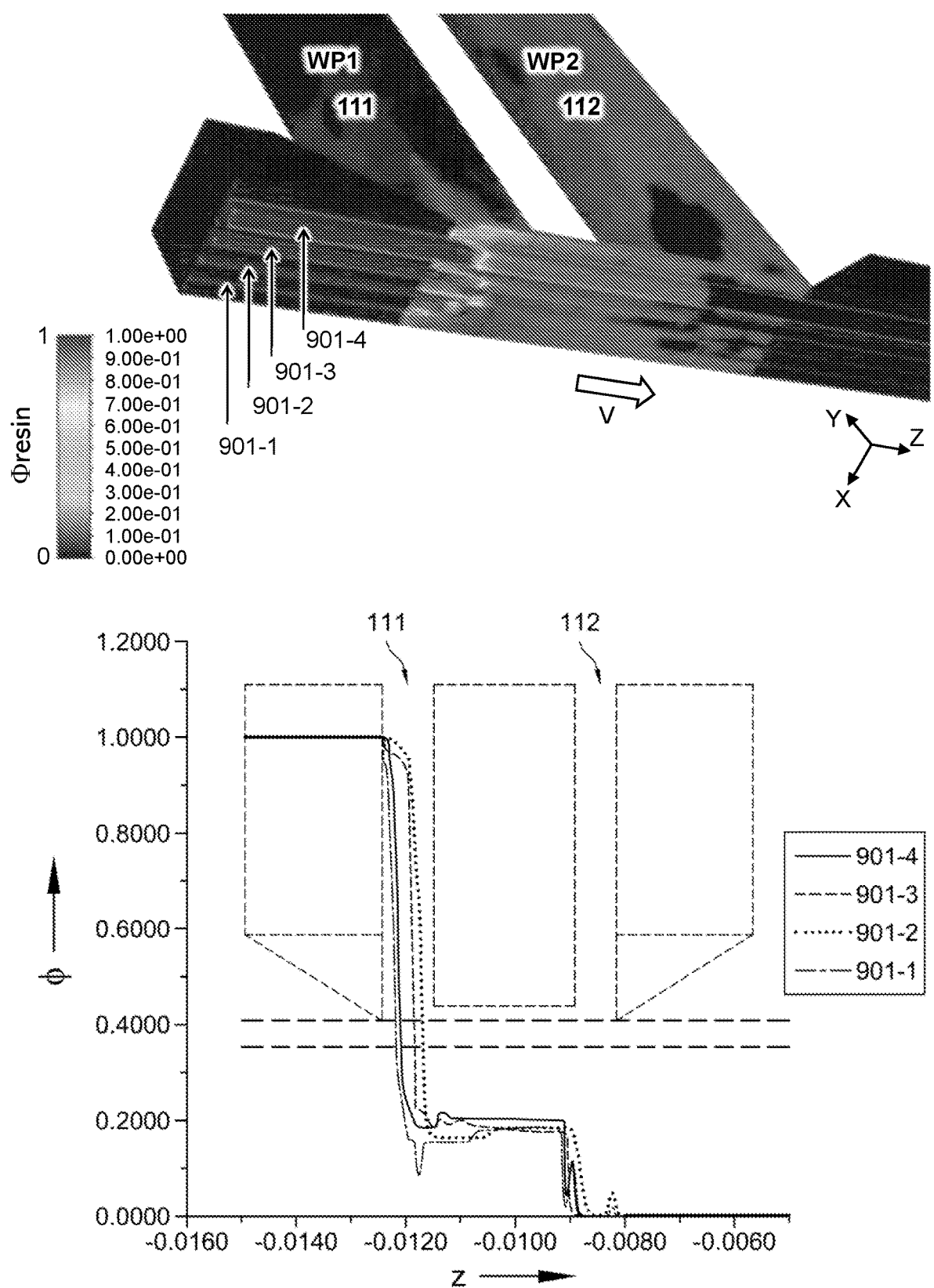
FIG. 10 illustrates cleaning of a groove.

FIG. 10 illustrates a method of cleaning a groove. The top image depicts exemplary grooves being cleaned using a dual chamber system as disclosed herein. The system is moved across the surface of a workpiece in a direction indicated by the arrow while in flush contact therewith. Like in FIG. 9 only the first and second deposition chambers 111, 112 of the system are shown. The workpiece comprises 4 grooves 901-1 to 901-4 that are each initially filled with an uncured resin. The leading chamber 111 (operated at WP1 slightly above ambient) contains a cleaning agent. The trailing chamber 112 is operated at an under pressure WP2 at which the deposited leaning agent is sucked up and out of the grooves. As the cleaning agent is removed resin dissolved therein is extracted from the grooves. The lower image shows a cross section along the groove indicating a filling level (fraction of resin) contained within the groove as the system passes along the groove. As can be seen from the traces the grooves can be effectively cleaned.

Figure 11:
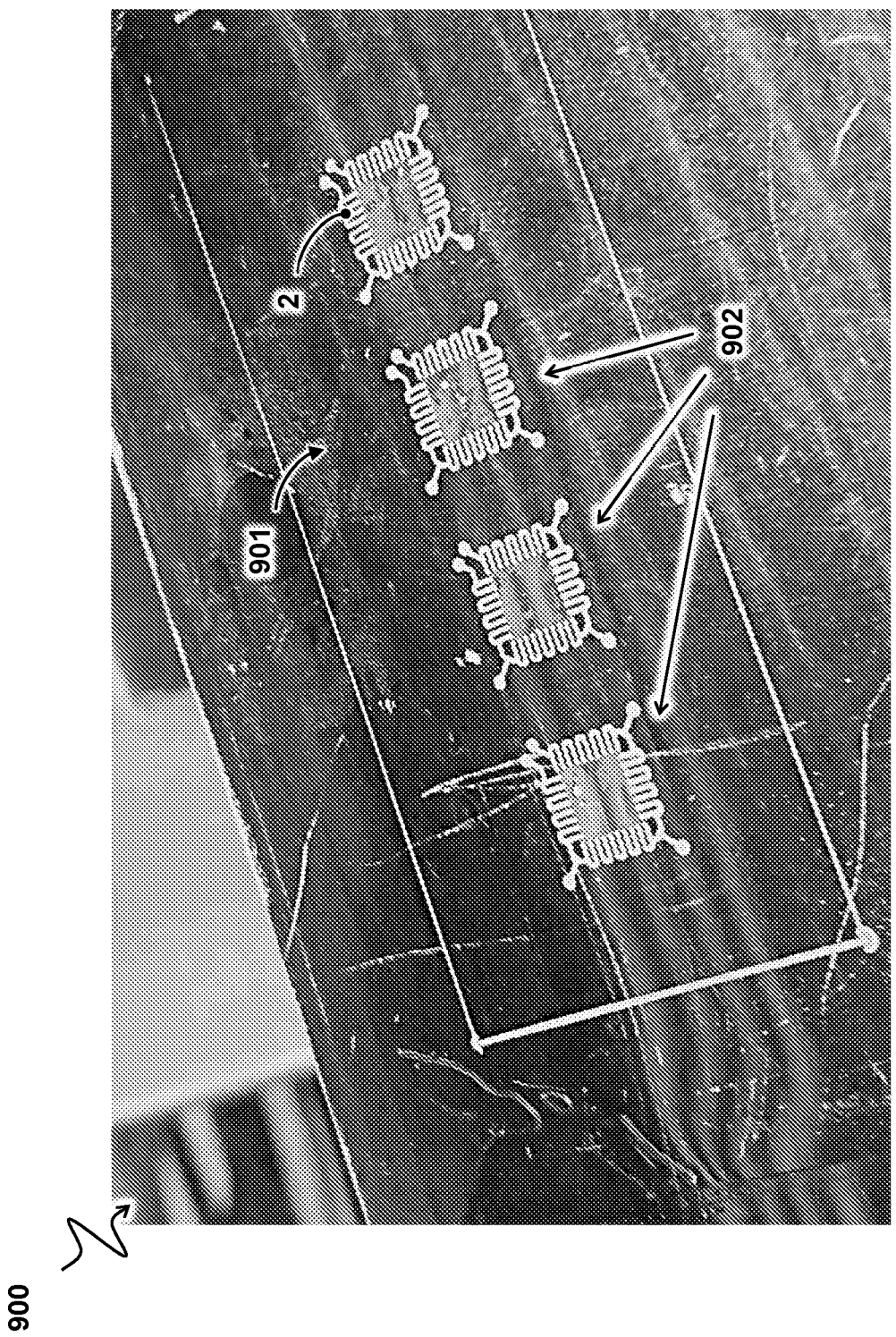
FIG. 11 depicts a workpiece with filled grooves.
Figure 12:
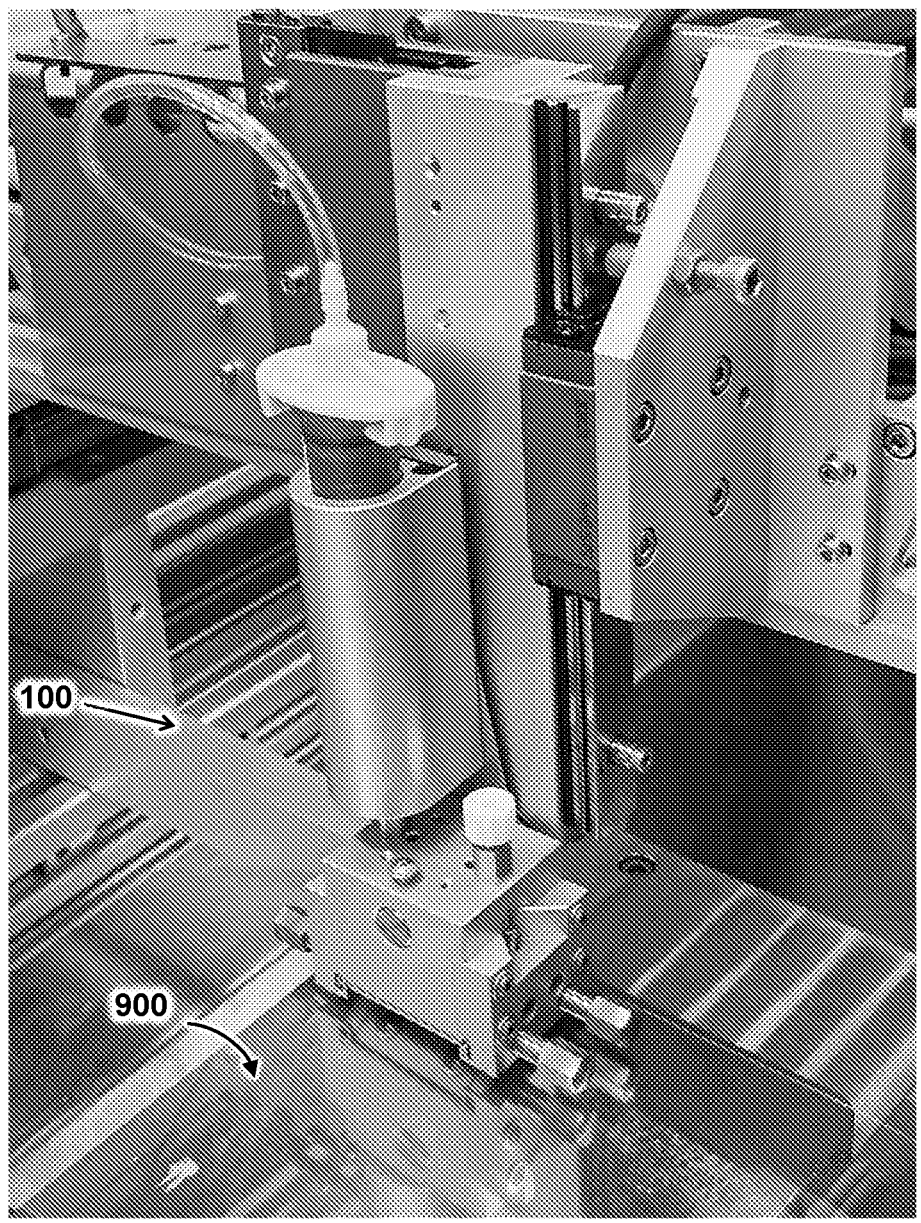
FIG. 12 depicts a deposition system in use.

FIG. 11 depicts a photo of a workpiece 900 having filled grooves 901' that are about 250 µm wide and about 50 µm deep. The grooves (tracks) are filled with a conductive silver paste 2 (DuPontPE828). In this particular workpiece the grooves have approximately similar dimensions. A single chamber system was found well suited for filling the grooves. FIG. 12 depicts the test setup 1 as used. The setup comprises single chamber system of the type shown in FIG. 1A, yet having a sliding mechanism as explained in relation to FIG. 3. The setup as shown includes a translation stage supporting a deposition head 100 while in contact with a workpiece 900. In case the workpiece would include groves with more variation in depth and/or width a dual chamber system can be more effective.

The grooves were filled at a pass speed of 25 mm/s, using a pressure of 3 bar and at a temperature of 20° C. The blades are formed of PEEK and have a length and thickness of respectively 6 and 1 millimeters. As explained in relation to FIG. 7A, the blades have a deflection of about 150 µm under these conditions. As can be observed, the surface directly next to the grooves remains exceptionally clean, which is an indication that the scraper blade is performing as expected. As can be seen for this particular setup, some material was deposited along the edges of the head, which can be removed, e.g. by wiper systems and/or by improving seals along terminal bounds of the deposition heads.

The filled tracks contact a bare die chip (50 µm thickness) embedded in a 3D print. After curing the paste at a temperature of 100° C. for 5 minutes all interconnects were found to be fully functional.

For the purpose of clarity and a concise description, features are described herein as part of the same or separate embodiments, however, it will be appreciated that the scope of the invention may include embodiments having combinations of all or some of the features described. Of course, it is to be appreciated that any one of the above embodiments or processes may be combined with one or more other embodiments or processes to provide even further improvements in finding and matching designs and advantages.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. A deposition system for depositing a printable medium in a groove provided within a surface of a workpiece, the deposition system comprising
   a deposition head including a deposition face; and
   a drive unit for providing relative motion between the deposition head and the workpiece in a direction transverse to the surface of the workpiece;
   wherein the deposition head comprises:
      a main body, including at least a first deposition chamber that is at least in part defined by a recess in the main body and that extends to a first orifice in the deposition face between at least two shutter elements; and
      a first pressurizing mechanism acting on the first deposition chamber, and configured to in use apply a first working pressure onto the printable medium contained in the first deposition chamber; and
      at least a first mount provided to the main body;
   wherein the at least two shutter elements include a first shutter element comprising a first blade extending from the first mount towards another of the at the least two shutter elements to close the first orifice between terminal ends of the first blade and another shutter element of the at least two shutter elements in a closed condition, and
   wherein the first blade is configured to flex in response to an applied first working pressure to at least partly open the first orifice;
   wherein the drive unit is arranged to, in use, adjust a relative position between the main body and the surface of the workpiece to maintain a flush contact between the surface of the workpiece and the terminal ends of the first blade and the other shutter element while in a flexed condition, and
   wherein:
      the other shutter element includes a separator wall extending longitudinally through the recess to define a second deposition chamber laterally separated from the first deposition chamber,
      the second deposition chamber extends to a second orifice in the deposition face between the other shutter element and a further shutter element of the at least two shutter elements,
      the further shutter element comprises a second blade extending from a corresponding second mount that is provided to the main body opposite the first mount across the recess towards the other shutter element to close the second orifice between terminal ends of the second blade and the other shutter element in a closed condition,
      the deposition system further comprises a second pressurizing mechanism acting on the second deposition chamber,
      the second pressurizing mechanism is configured to, in use, apply a second working pressure onto a printable medium contained in the second deposition chamber, and
      wherein the second blade is configured to flex in response to an applied second working pressure to at least partly open the second orifice.

2. The deposition system according to claim 1, wherein the first mount is arranged to, in use, adjust a position and/or orientation of the first blade relative to the main body in dependence of at least the first working pressure, so as to, in use, at least partly counteract a contact pressure between the terminal end of the first blade and the surface of the workpiece so as to, in use, maintain a flush contact between the surface of the workpiece and the terminal ends of the first blade and the other shutter element.

3. The deposition system according to claim 2, wherein the first mount comprises a retracting mechanism arranged to, in use, retract the first blade in a direction along the first blade.

4. The deposition system according to claim 1, further comprising a sliding element provided at the terminal end of the other shutter element and
   wherein the sliding element extends along the deposition face,
   wherein the sliding element is:
      arranged to, in closed condition, contact terminal ends of the first blade and the second blade along opposing terminal ends of the sliding element, and
      arranged to, in a partly opened condition, provide a first orifice and a second orifice between the sliding element and the first blade and the second blade, respectively.

5. The deposition system according to claim 1, wherein the first orifice and the second orifice are laterally separated from each other by a distance, wherein the distance is in a range between 1 and 10 millimeters.

6. The disposition system according to claim 1, arranged to, in use, deposit a cleaning agent from one deposition chamber of the first deposition chamber and the second deposition chamber, and arranged to at least partly recover the cleaning agent via an other deposition chamber of the first deposition chamber and the second deposition chamber by applying a positive working pressure to the one deposition chamber and applying an under pressure to the other deposition chamber.

7. The deposition system according to claim 1, wherein the other shutter element comprises a further blade extending towards the terminal end of the first blade from a corresponding mount provided to the main body opposite the first mount across the recess.

8. A deposition system assembly comprising:
   a first deposition system according to claim 1; and
   a second deposition system according to claim 6,
   wherein the second deposition system is arranged to provide cleaned grooves by depositing a cleaning agent to clean grooves provided within a surface of a workpiece; and
   wherein the first deposition system is arranged to provide filled grooves by depositing a high solid content printable medium in the cleaned grooves.

9. A deposition system for depositing a printable medium in a groove provided within a surface of a workpiece, the deposition system comprising;
   a deposition head including a deposition face; and
   a drive unit for providing relative motion between the deposition head and the workpiece in a direction transverse to the surface of the workpiece;
   wherein the deposition head comprises:
      a main body, including at least a first deposition chamber that is at least in part defined by a recess in the main body and that extends to a first orifice in the deposition face between at least two shutter elements; and a first pressurizing mechanism acting on the first deposition chamber, and configured to in use apply a first working pressure onto the printable medium contained in the first deposition chamber; and at least a first mount provided to the main body, wherein the at least two shutter elements include a first shutter element comprising a first blade extending from the first mount towards another of the at the least two shutter elements to close the first orifice between terminal ends of the first blade and an other shutter element of the at least two shutter elements in a closed condition, and wherein the first blade is configured to flex in response to an applied first working pressure to at least partly open the first orifice;

wherein the drive unit is arranged to, in use, adjust a relative position between the main body and the surface of the workpiece to maintain a flush contact between the surface of the workpiece and the terminal ends of the first blade and the other shutter element while in a flexed condition; and wherein the first mount is arranged to, in use, adjust a position and/or orientation of the first blade relative to the main body in dependence of at least the first working pressure, so as to, in use, at least partly counteract a contact pressure between the terminal end of the first blade and the surface of the workpiece so as to, in use, maintain a flush contact between the surface of the workpiece and the terminal ends of the first blade and the other shutter element.

10. The deposition system according to claim 9, wherein the first mount comprises a retracting mechanism arranged to, in use, retract the first blade in a direction along the first blade.

* * * * *